United States Patent
Liu et al.

(10) Patent No.: US 6,687,157 B1
(45) Date of Patent: Feb. 3, 2004

(54) CIRCUITS AND METHODS FOR IDENTIFYING A DEFECTIVE MEMORY CELL VIA FIRST, SECOND AND THIRD WORDLINE VOLTAGES

(75) Inventors: Ping-Chen Liu, Fremont, CA (US); Michael G. Ahrens, Sunnyvale, CA (US); Kenneth V. Miu, Shanghai (CN)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/460,097

(22) Filed: Jun. 11, 2003

(51) Int. Cl.[7] ............................................. G11C 29/00
(52) U.S. Cl. ........................... 365/185.09; 365/185.02; 365/185.18; 365/200; 365/201; 365/189.12
(58) Field of Search ..................... 365/185.09, 185.02, 365/185.18, 185.23, 201, 200, 189.12, 189.11, 189.07

(56) References Cited

U.S. PATENT DOCUMENTS

| | | | | |
|---|---|---|---|---|
| 5,581,508 A | 12/1996 | Sasaki et al. | ................ | 365/200 |
| 5,644,541 A | 7/1997 | Siu et al. | ..................... | 365/200 |
| 5,652,725 A | 7/1997 | Suma et al. | ................ | 365/200 |
| 5,742,615 A | * 4/1998 | Kondo et al. | ................ | 714/720 |
| 6,201,745 B1 | 3/2001 | Ryu et al. | ................... | 365/200 |
| 6,324,105 B1 | 11/2001 | Shirley | ........................ | 365/200 |
| 6,388,925 B1 | 5/2002 | Kim | .......................... | 365/200 |

FOREIGN PATENT DOCUMENTS

| | | | | |
|---|---|---|---|---|
| JP | 1-23878 | * 5/1989 | ........... | G11C/11/34 |
| JP | 1-46949 | * 10/1989 | ........... | G11C/11/34 |
| JP | 4-143999 | * 5/1992 | ........... | G11C/29/00 |

OTHER PUBLICATIONS

Fujitsu, "Redundant Circuit Technology and Variable Reference Voltage Circuit Technology for FRAM"FIND, Nov. 30, 2001, pp. 28–31, vol. 19, No. 4, available from Fujitsu, 3545 North First Street, San Jose, CA 95134–1804.

* cited by examiner

*Primary Examiner*—Andrew Q. Tran
(74) *Attorney, Agent, or Firm*—Arthur J. Behiel; Edel M. Young; Justin Liu

(57) ABSTRACT

Disclosed are circuits and methods of identifying defective memory cells among rows and columns of memory cells. In one embodiment, all the memory cells in an array are programmed to conduct with a conventional read voltage applied and not to conduct with a conventional read-inhibit voltage applied. Any rows that conduct with the read-inhibit voltage applied are termed "leaky," and are defective. Another read-inhibit voltage lower than the conventional level is selected to cause even leaky cells not to conduct. This test read-inhibit voltage is consecutively applied to each row under test. If one of the rows includes a leaky bit, that bit will conduct with the conventional read-inhibit voltage applied but will not conduct with the test read-inhibit voltage applied. The test flow therefore identifies a row as including a leaky bit when a leak is suppressed by application of the test read-inhibit voltage. A redundant row can be provided to replace a row having a leaky bit.

19 Claims, 10 Drawing Sheets

CIRCUITS AND METHODS FOR IDENTIFYING A DEFECTIVE MEMORY CELL VIA FIRST, SECOND AND THIRD WORDLINE VOLTAGES

FIELD OF INVENTION

The invention relates generally to methods and circuits for identifying a defective memory cell in an array of memory cells.

BACKGROUND

Conventionally, non-volatile semiconductor memory structures with high levels of integration (e.g., EPROM, EEPROM, flash EPROM, and the like) suffer from high defect rates. A significant percentage of defects common to non-volatile memory produce so-called "leaky" memory cells, which lead to memory misreads, greatly depressing memory yield.

FIG. 1(a) (prior art) depicts a configurable memory cell 100, including a storage transistor T1. Storage transistor T1 includes a floating gate 115, a control gate 117 connected to a wordline 120, a drain terminal 125 connected to a bitline 130, and a source terminal 135 connected to a ground terminal. During a programming operation, different voltages are applied to wordline 120 and bitline 130 causing electron tunneling from floating gate 115 to drain 125. This transfer of negative charge from floating gate 115 decreases the threshold voltage of storage transistor T1 (to a programmed threshold voltage $V_{THP}$). During an erase operation, different voltages are applied to wordline 120 and bitline 130 causing electron tunneling from drain 125 to floating gate 115, the reverse of the programming process. This transfer of negative charge to floating gate 115 increases the threshold voltage of storage transistor T1 (to an erased threshold voltage $V_{THE}$).

To read memory cell 100, a read voltage $V_R$ is applied to wordline 120. The threshold voltage $V_{THP}$ of a programmed cell is less than the read voltage $V_R$, so transistor T1 conducts with read voltage $V_R$ applied to control gate 117 if memory cell 100 is programmed; in contrast, the threshold voltage $V_{THE}$ of an erased cell is above the read voltage $V_R$, so transistor T1 does not conduct with read voltage $V_R$ applied to wordline 120 if memory cell 100 is erased. Whether a given cell conducts with the read voltage applied to the control gate is therefore indicative of the program state of the cell. In the following examples, the programmed state corresponds to a logic-zero state (a "logic zero") and the erased state corresponds to a logic-one state (a "logic one").

FIG. 1(b) (prior art) depicts a memory array 150 including N rows and M columns of memory cells 100. Each row of memory array 150 includes M storage transistors T1 with their respective control gates connected to one wordline. For example, all M control gates of storage transistors T1 in a first row are connected to a first wordline WL<1>. Each column of memory array 150 includes N storage transistors T1 with their respective drain terminals connected to one bitline. For example, all N drain terminals of storage transistors T1 in a first column are connected to a first bitline BL<1>.

As discussed above in connection with FIG. 1(a), programming and erasing memory cells 100 of memory array 150 includes applying appropriate voltages on the M wordlines and N bitlines. Program and erase voltages are chosen so that all memory cells 100 in memory array 150 exhibit a nominal programmed threshold voltage $V_{THP}$ and a nominal erased threshold voltage $V_{THE}$. The nominal values of programmed and erased threshold voltages $V_{THP}$ and $V_{THE}$ determine the appropriate read voltage $V_R$ value used during a read operation.

During a read operation, all bitlines are pre-charged to a relatively high voltage representative of a logic one. Then read voltage $V_R$ is applied to a selected wordline WL<K> while a read-inhibit voltage $V_{RI}$ less than the programmed threshold voltage $V_{THP}$ is applied to all unselected wordlines (i.e., the control gates of the cells-within memory array 150 not being read). Thus biased, only programmed memory cells on the selected wordline WL<K> will conduct, pulling respective bitlines to a low voltage level representative of a logic zero; and neither programmed nor erased cells on all unselected wordlines conduct.

Memory array 150 can have one or more defective memory cells. A memory cell is "defective" if its electrical characteristics are outside of an acceptable range. For example, a leaky memory cell exhibits a programmed threshold voltage $V_{THP}$ that is substantially less than required. If the programmed threshold voltage $V_{THP}$ of a given memory cell is below the read-inhibit voltage $V_{RI}$, that memory cell will "leak" when not selected, causing the associated column to read a logic zero regardless of whether a programmed or erased cell is selected.

Modern memory circuits include spare rows or columns of memory cells that can be substituted for respective rows or columns that include defective cells. It can be difficult, however, to precisely locate some types of defects. For example, a leaky memory cell affects an entire column, making it difficult to single out the defective cell. Replacing the defective column solves the problem in many instances; however, redundant rows are preferred for some memory architectures, so it may be important to identify the defective row. Moreover, even in the absence of redundant rows or columns, identifying defective memory cells aids in troubleshooting manufacturing processes. There is therefore a need for circuits and methods for identifying individual defective memory cells.

SUMMARY

The present invention is directed to circuits and methods for identifying defective memory cells in memory arrays. In one embodiment, all the memory cells in an array are programmed to conduct with a conventional read voltage applied and not to conduct with a conventional read-inhibit voltage applied. Any rows that conduct with the read-inhibit voltage applied are termed "leaky," and are defective. Another read-inhibit voltage lower than the conventional level is selected to cause even leaky cells not to conduct. This test read-inhibit voltage is consecutively applied to each row under test. If one of the rows includes a leaky bit, that bit will conduct with the conventional read-inhibit voltage applied but will not conduct with the test read-inhibit voltage applied. The test flow therefore identifies a row as including a leaky bit when a leak is suppressed by application of the test read-inhibit voltage. A redundant row can be provided to replace a row having a leaky bit.

In one embodiment, a memory array includes a test row and some wordline select logic. During a test operation, the wordline select logic simultaneously applies three wordline voltages, a pair of read-inhibit voltages $V_{RI1}$ and $V_{RI2}$ and a read voltage $V_R$, to wordlines in the memory-cell array. The first wordline voltage $V_{RI1}$ is an unusually low read-inhibit voltage of a level selected to insure that even leaky cells will not conduct. The second and third wordline voltages $V_{RI2}$ and VR are conventional read-inhibit and read voltages, respectively.

In a test method in accordance with one embodiment, each memory cell is erased (i.e., is configured to exhibit a relatively high erased threshold voltage $V_{THE}$). Each row other than the test row is then programmed (i.e., is configured to exhibit a relatively low programmed threshold voltage $V_{THP}$). The wordline select logic then applies the conventional read voltage $V_R$ to the wordline of the test row. Being erased, the memory cells in the test row do not conduct. At the same time, the wordline select logic applies the low read-inhibit voltage VRI1 to the wordline associated with one of the rows under test and applies the conventional read-inhibit voltage $V_{RI2}$ to the remaining wordlines.

The read voltage on the test-row wordline is less than the erased threshold voltage, so the memory cells in the test row are biased off and will not conduct. The first read-inhibit voltage is less than the programmed threshold voltage, so low in fact that even leaky cells will not conduct. Thus, the memory cells within the associated row will not conduct even if leaky. Finally, the second read-inhibit voltage will prevent properly working programmed memory cells from conducting, but is insufficient to render leaky memory cells nonconductive. Thus biased, any conduction in the memory array indicates that one of the memory cells with the second read-inhibit voltage applied is leaking.

The first read-inhibit voltage is consecutively applied to each row under test. If one of the rows includes a leaky bit, that bit will conduct in every case except when the first read-inhibit voltage is applied to the leaky cell. The test flow therefore identifies a row as including a leaky bit when a leak is suppressed by application of a relatively strong read-inhibit voltage. Once a defective bit is identified, the row address of the leaky cell is stored for later consideration. Some embodiments include redundant rows, which can be substituted for row containing defective bits.

The allowed claims, and not this summary, define the scope of the invention.

DETAILED DESCRIPTION

Figure 1:
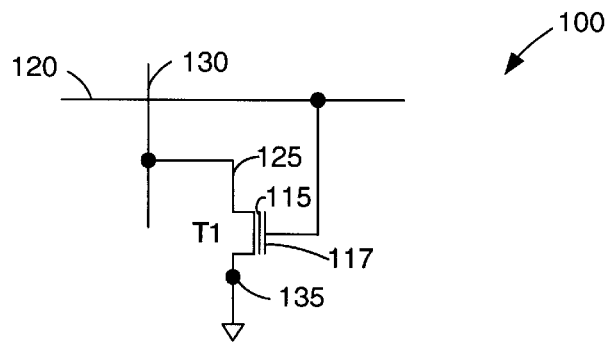
FIG. 1(a) (prior art) is a diagram of a memory cell.
FIG. 1(b) (prior art) is a diagram of an N-by-M memory array.
Figure 1:
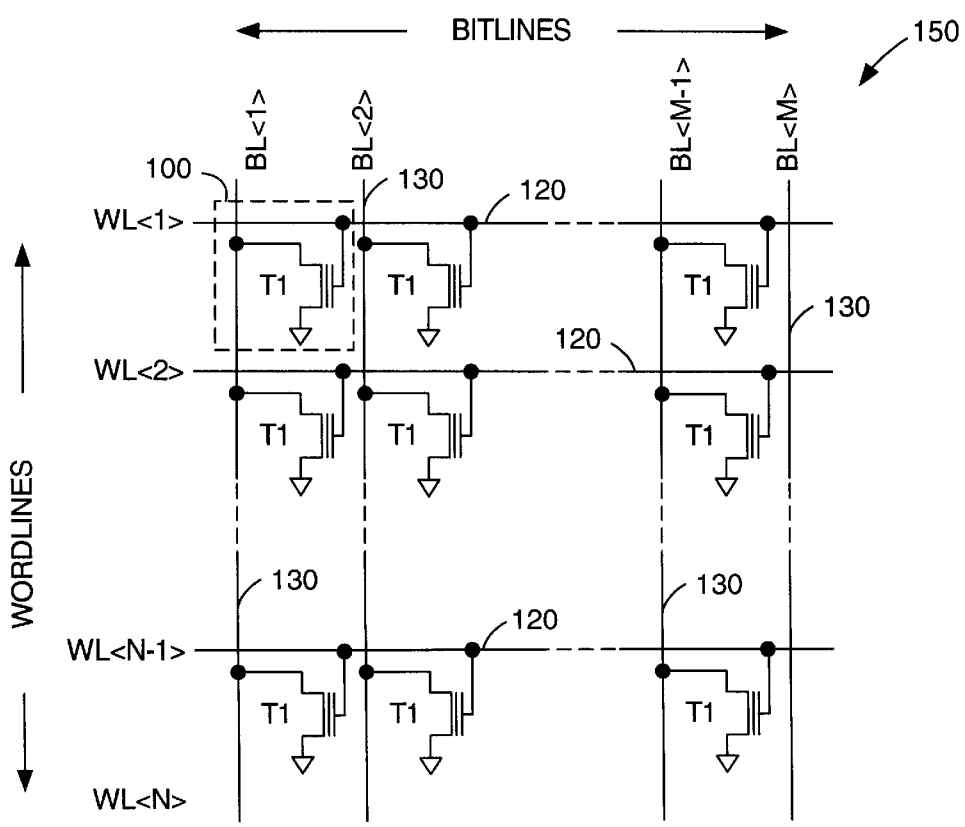
Figure 2:
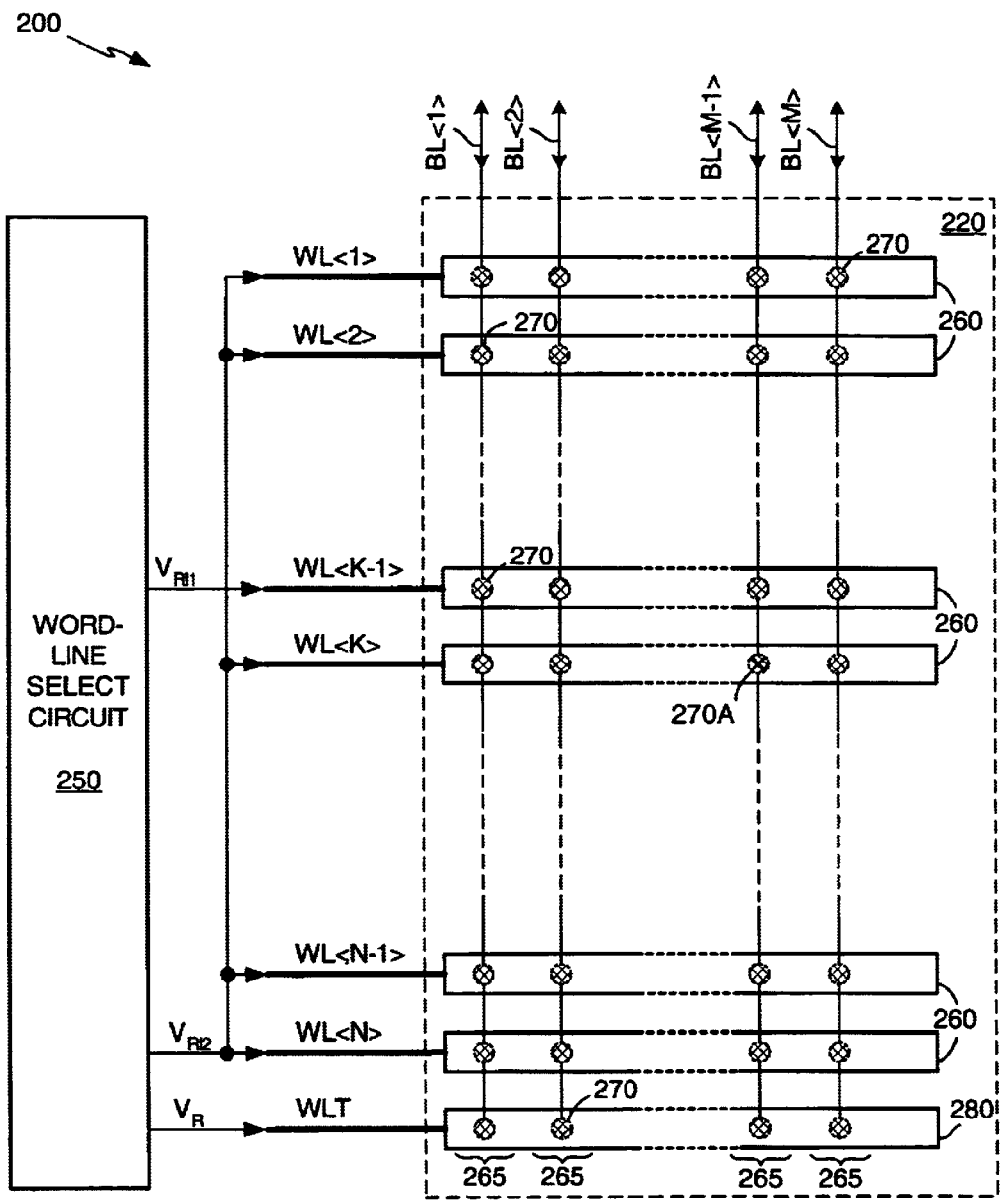
FIG. 2 is a block diagram of a memory circuit.

FIG. 2 depicts a memory circuit 200 in accordance with one embodiment of the invention. Memory circuit 200 includes a memory block 220 that conventionally includes an array of memory cells 270 arranged in a plurality of rows 260 and columns 265. Each memory cell 270 is the same or similar to memory cell 100 of FIG. 1(a). Memory circuit 200 additionally includes a test row 280 and a wordline select circuit 250 connected to rows 260 and 280 via a plurality of respective wordlines WL<1:N> and WLT. Wordline select circuit 250 is adapted to simultaneously apply three wordline voltages $V_{RI1}$, $V_{RI2}$, and VR to memory block 220 to support test methods that identify individual defective memory cells. The following example assumes a leaky memory cell 270A for illustrative purposes.

Figure 3:
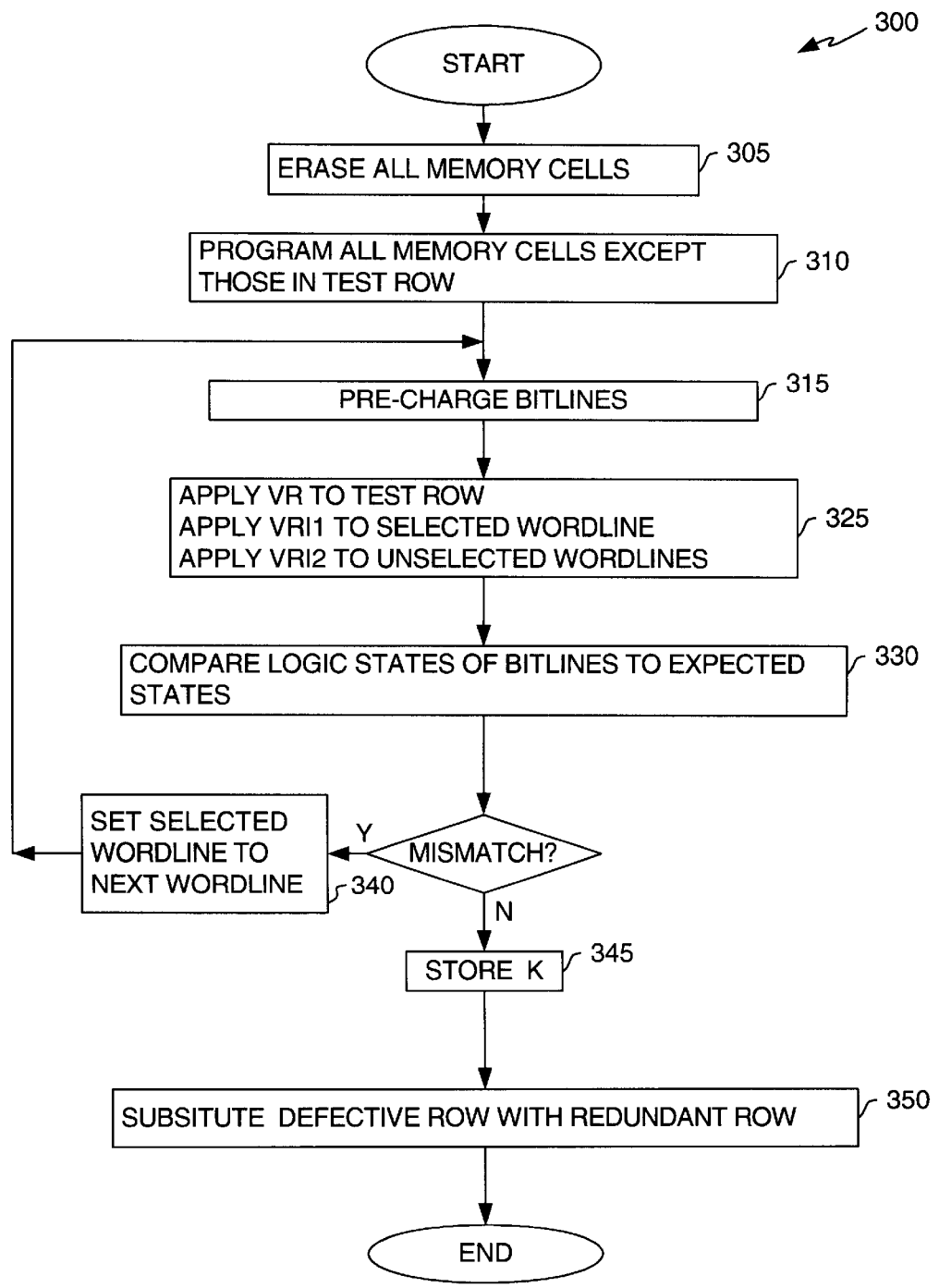
FIG. 3 is a flow chart of a test method identifying a defective memory cell.

FIG. 3 depicts a flow chart 300 illustrating a method of testing memory circuit 200 of FIG. 2 to identify defective memory cells (e.g., leaky memory cell 270A in the example). The following discussion employs memory circuit 200 in conjunction with flow chart 300.

Beginning with step 305, each memory cell 270 within memory block 220 is erased (i.e., is configured to exhibit an erased threshold voltage $V_{THE}$). Next, in step 310, each row except test row 280 is programmed (i.e., is configured to exhibit a programmed threshold voltage $V_{THP}$) In the following sequence of steps, the contents of test row 280 are read with each of the remaining rows 260 inhibited.

As with a normal read operation, bitlines BL<1:M> are pre-charged to a level representative of a logic one (step 315). In step 325, wordline select circuit 250 simultaneously applies:

1. a read voltage $V_R$ to test row 280 via test wordline WLT;
2. a first read-inhibit voltage $V_{RI1}$ to one of rows 260 to be tested for leaky bits (e.g., wordline WL<K−1>); and
3. a second read-inhibit voltage $V_{RI2}$ to the remaining wordlines (e.g., wordlines WL<1> through WL<K−2> and WL<K> through WL<N>).

Read voltage $V_R$ is greater than programmed threshold voltage $V_{THP}$ but less than erased threshold voltage $V_{THE}$. Thus, memory cells in test row 280 are off and do not affect the logic state of the pre-charged bitlines. First read-inhibit voltage $V_{RI1}$ is less than programmed threshold voltage $V_{THP}$, and is selected to be sufficiently low that even leaky cells will not conduct with read-inhibit voltage $V_{RI1}$ applied on the respective wordline; thus, memory cells in the row 260 to which first read-inhibit voltage $V_{RI1}$ is applied do not conduct even if leaky. Second read-inhibit voltage $V_{R12}$ is a conventional read-inhibit voltage; thus, memory cells in the rows 260 to which read-inhibit-voltage $V_{RI2}$ is applied conduct if leaky but do not otherwise conduct. In one embodiment, read voltage $V_R$ is three volts, programmed threshold voltage $V_{THP}$ is about zero to 1.5 volts, erased threshold voltage is about 4 to 6 volts, second read-inhibit voltage $V_{RI2}$ is negative two volts, and first read-inhibit voltage $V_{RI1}$ is negative four volts.

Next, in step 330, the logic states of bitlines BL<1:M> are examined with the three wordline voltages applied. Any logic zeroes indicate the presence of a leaky memory cell among the cells to which read-inhibit voltage $V_{RI2}$ is applied. In the illustration of FIG. 2, defective memory cell 270A is provided with a read-inhibit voltage $V_{RI2}$ insufficient to turn off leaky memory cell 270A, so bitline BL<M−1> is pulled down to a low logic level, indicating an error. Due to the resulting mismatch between the level provided on bitline BL<M−1> and the expected correct level, wordline select circuit 250 selects the next wordline WL<K> for application of read-inhibit voltage $V_{RI}$ (step 340) and the process returns to step 315.

Steps 315 through 330 are repeated, this time with first read-inhibit voltage $V_{RI1}$ applied to wordline WL<K>, the wordline associated with leaky memory cell 270A. Because read-inhibit voltage $V_{RI1}$ is low enough to render a leaky cell non-conductive, bitline BL<M−1> will no longer produce an error. The test flow therefore indicates that the relatively low read-inhibit voltage $V_{RI1}$ is currently suppressing the leaky bit, identifying the row associated with the selected wordline WL<K> as including the leaky memory cell. The row address of the leaky cell is then stored (step 345) for later consideration. Where redundant rows are included, the row address of leaky cell 270A can be used to substitute the associated defective row with a redundant row (step 350).

Figure 4:
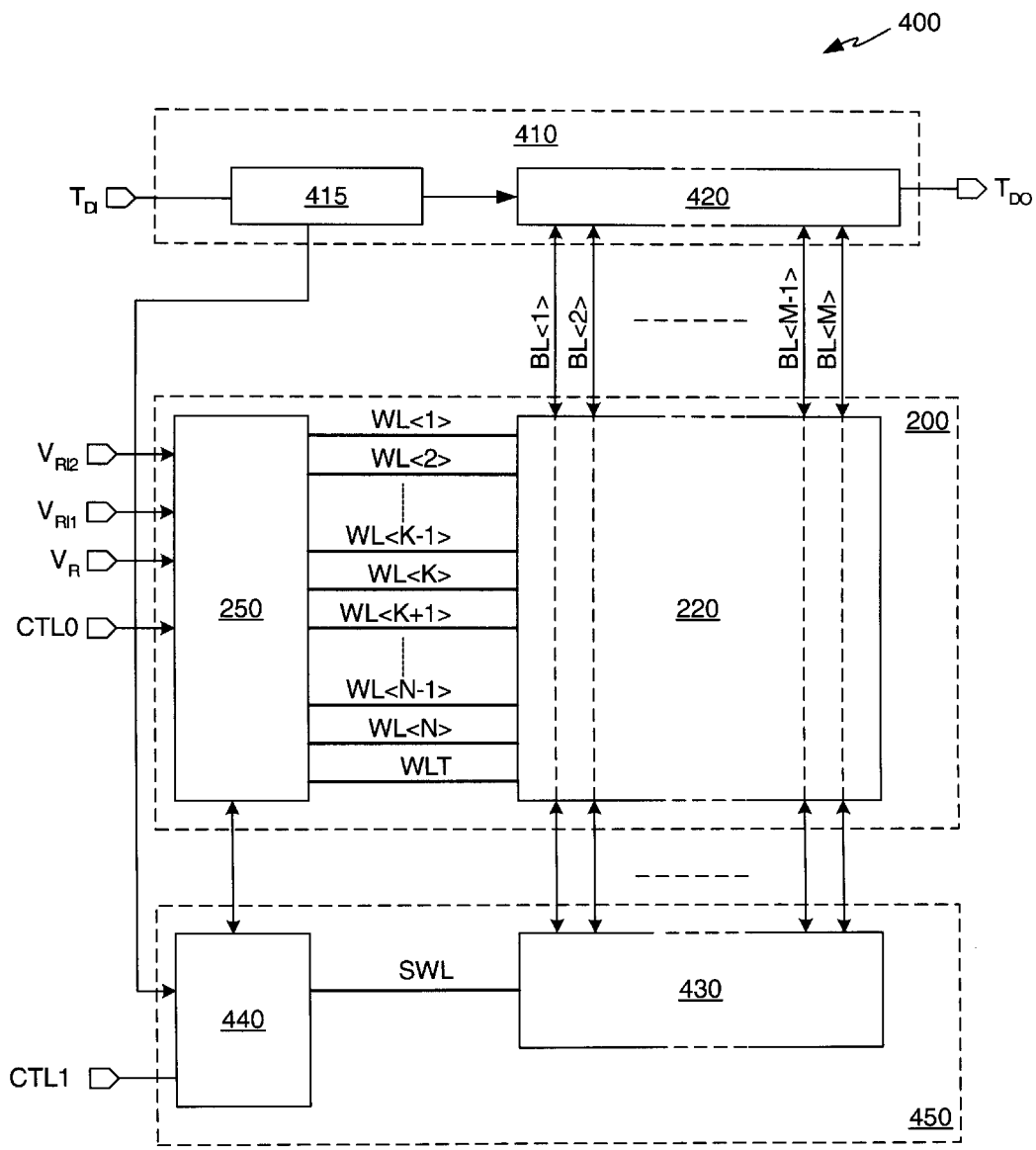
FIG. 4 a block diagram of an ISC memory assembly with redundancy row capability.

FIG. 4 depicts a memory assembly 400 with row substitution capability in accordance with one embodiment of the invention. Memory assembly 400 includes memory circuit 200 of FIG. 2 in communication with an in-system configuration (ISC) memory access circuit 410 and a row substitution circuit 450. Memory circuit 200 receives read voltage $V_R$, first read-inhibit voltage $V_{RI1}$, second read-inhibit voltage $V_{RI2}$, and control signals via a control bus CTL0. Control bus CTL0 conveys all signals required by wordline select circuit 250 for proper operation. ISC memory access circuit 410 supports a conventional JTAG protocol that allows configuration of devices mounted on a printed-circuit board. ISC memory access circuit 410 includes an address register 415 connected to a data shift register 420. Address register 415 receives-serial data on a serial input terminal $T_{DI}$ and serially transmits the data to data shift register 420. Also, address register 415 can transmit parallel address data to row substitution circuit 440. Data shift register 420 includes the same number of bits as the columns of memory block 220. Each bit of data-shift register 420 connects to a corresponding one of the plurality of bitlines. Thus, data shift register 420 either receives serial data from address register 415 or parallel data from bitlines BL<1:M>, and either transmits serial data on output serial terminal TDO or parallel data to bitlines BL<1:M>.

Row substitution circuit 450 includes a redundant row 430, similar to rows 260 of FIG. 2, and a row substitution control circuit 440. Redundant row 430 includes M memory cells, each connected to a swap wordline SWL and a corresponding one of bitlines BL<1:M>. Row substitution control circuit 440 receives and stores the address of a defective row, as discussed with respect to flowchart 300 of FIG. 3, and controls access to redundant row 430 through swap wordline SWL. For each memory access (read or write), row substitution circuit 440,compares the stored address to the contents of address register 415. If a match is found, indicating address register 415 contains an address for a row identified as defective, row substitution circuit 440 directs the memory access to redundant row 430 and generates a disable signal in response to this address, which disables access to all rows but the redundant-row. Memory assembly 400 thus facilitates row substitution to correct for defective memory cells.

Figure 5:
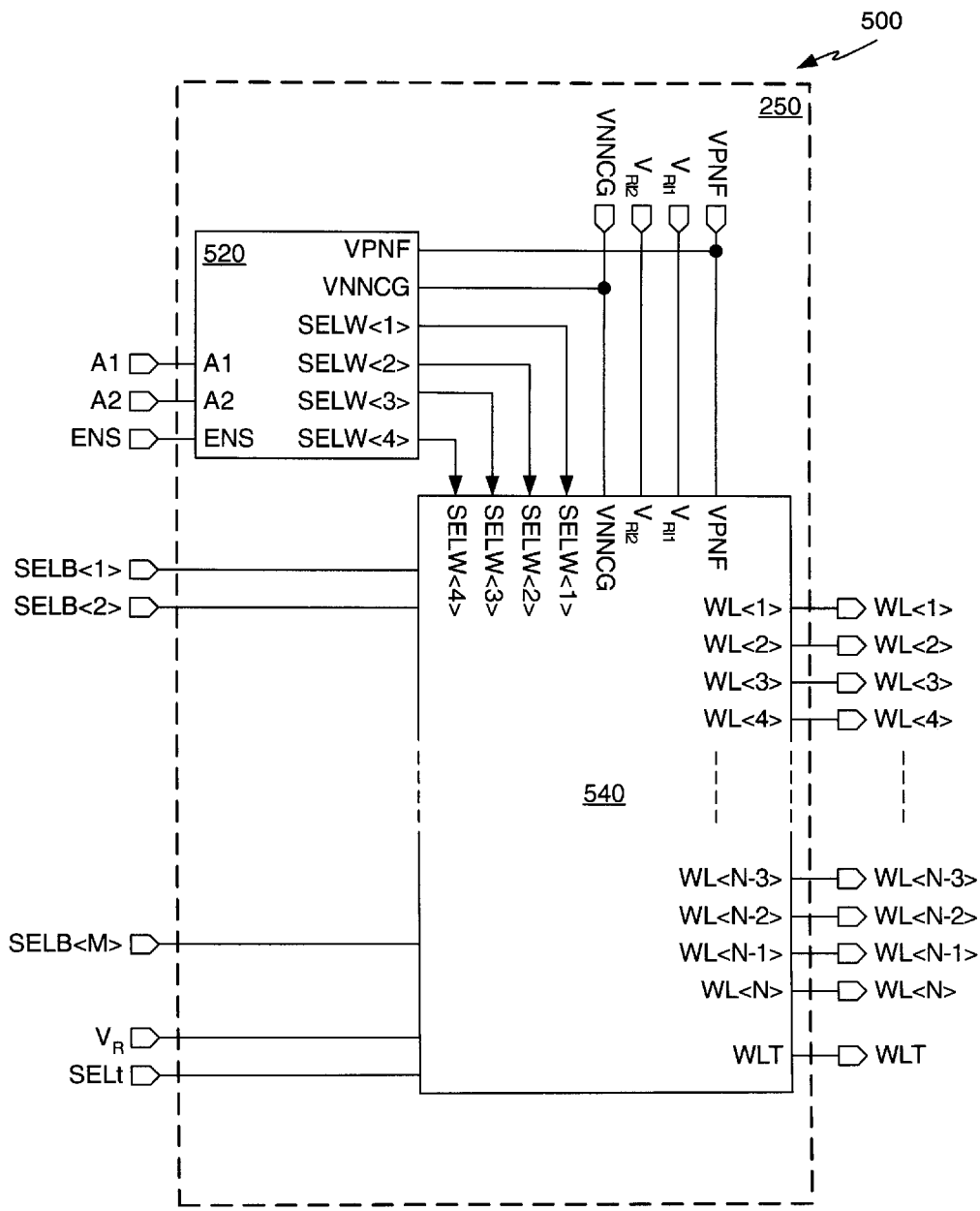
FIG. 5 is a detailed block diagram of a wordline select circuit.

FIG. 5 is a block diagram 500 of wordline select circuit 250 (FIGS. 2 and 4) in accordance with one embodiment. Wordline select circuit 250 includes a top decoder 520 receiving and transmitting signals to a row decoder 540. Wordline voltages $V_R$, $V_{RI1}$, and $V_{RI2}$ are provided to wordline select circuit 250 on like-named terminals. The remaining terminals are part of control bus CTL0 of FIG. 4. Top decoder 520 receives control signals A1, A2, and enable-select signal ENS and transmits input voltage VPNF to row decoder 540 via a selected one of wordline-select lines SELW<1:4>, and input voltage VNNCG via the unselected ones of wordline-select lines SELW<1:4>. Table 1 describes the logical functionality of top decoder 520.

TABLE 1

| ENS | A1 | A2 | SELW<1> | SELW<2> | SELW<3> | SELW<4> |
|---|---|---|---|---|---|---|
| 0 | 0 | 0 | VPNF | VNNCG | VNNCG | VNNCG |
| 0 | 0 | 1 | VNNCG | VPNF | VNNCG | VNNCG |
| 0 | 1 | 0 | VNNCG | VNNCG | VPNF | VNNCG |
| 0 | 1 | 1 | VNNCG | VNNCG | VNNCG | VPNF |
| 1 | X | X | VPNF | VPNF | VPNF | VPNF |

In a normal read operation, row decoder 540 applies a read voltage VR to a selected wordline and a conventional read-inhibit voltage to the unselected wordlines. In a test-row read operation, row decoder 540 applies read voltage VR to test wordline TWLT, read-inhibit voltage VRI1 to one of wordlines WL<1:N>, and read-inhibit voltage VRI2 to the remaining wordlines. Select signals on lines SELB<1:M> and ELW<1:4> determine which wordlines receive which read-inhibit voltage. Decoders 520 and 540 are detailed below.

Figure 6A:
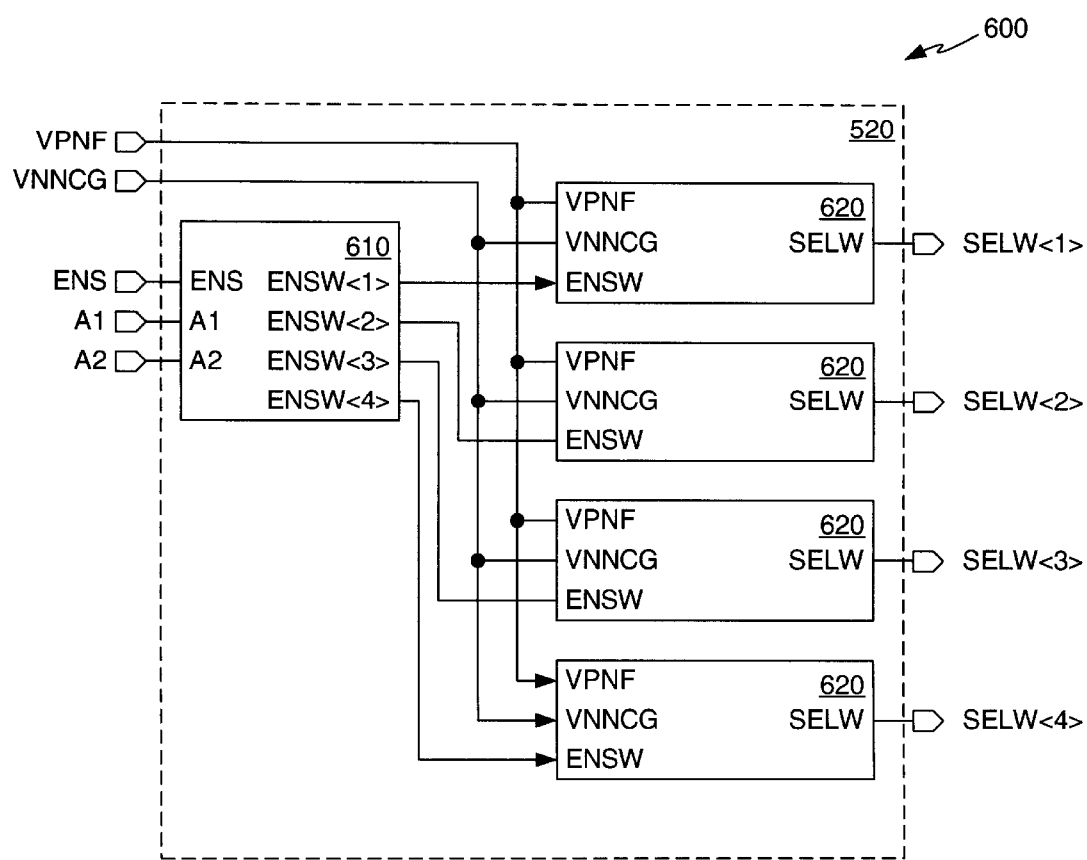
FIG. 6(a) is a detailed block diagram of a top decoder.
Figure 6:
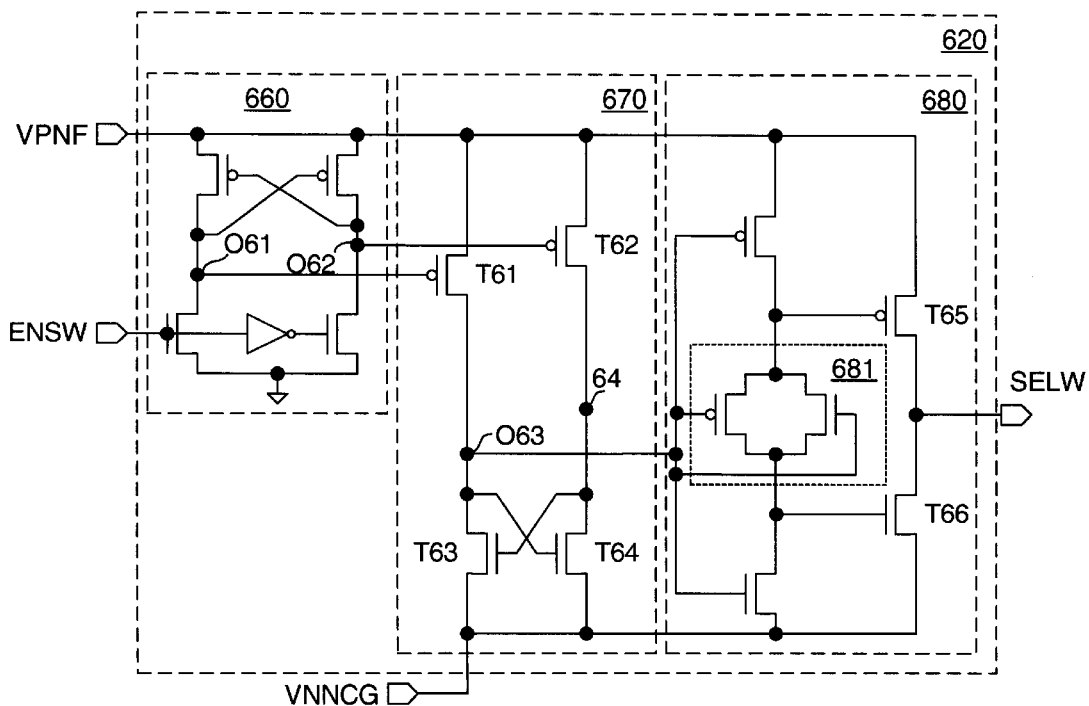
FIG. 6(b) is a detailed circuit diagram of a two-stage voltage level shifter circuit.

FIG. 6(a) is a block diagram 600 of an embodiment of top decoder 520 of FIG. 5. Top decoder 520 includes wordline-select circuit 610 receiving control signals A1, A2, and enable-select ENS and transmitting enable-select-wordline signals ENSW<1:4> to respective select-wordline drivers 620. Enable-select-wordline signals ENSW<1:4> control whether select-wordline driver 620 transmits input voltage VPNF or input voltage VNNCG to a wordline-select terminal. Thus during operation, wordline-select circuit 610 enables only one of select-wordline drivers 620 to transmit input voltage VPNF on respective wordline-select terminal SELW<1:4> as shown above in Table 1.

FIG. 6(b) details an embodiment of select-wordline driver 620 of FIG. 6(a). Select-wordline driver 620 includes a voltage-level shifter 660 that shifts enable-select-wordline signal ENSW from switching between a voltage range of zero-to-VDD to a voltage range of zero-to-VPNF. Voltage-level shifter 660 then applies the level-shifted signal to a second voltage-level shifter 670.

Voltage-level shifter 670 shifts the level shifted signal from a voltage range of zero-to-VPNF to a voltage range of VNNCG-to-VPNF. Voltage-level shifter 670 transmits the resulting voltage-level shifted signal to an output circuit 680. Output circuit 680 then generates a select-wordline signal SELW, a version of enable-select wordline signal ENSW, exhibiting a broader voltage range. In one embodiment, input voltages VPNF and VNNCG are three and negative four volts, respectively. Select-wordline circuit 620 thus level-shifts enable-select wordline signals ENSW, switching between supply voltage and ground, to output signal (enable-select wordline ENWL), switching between three and negative four volts.

Figure 7:
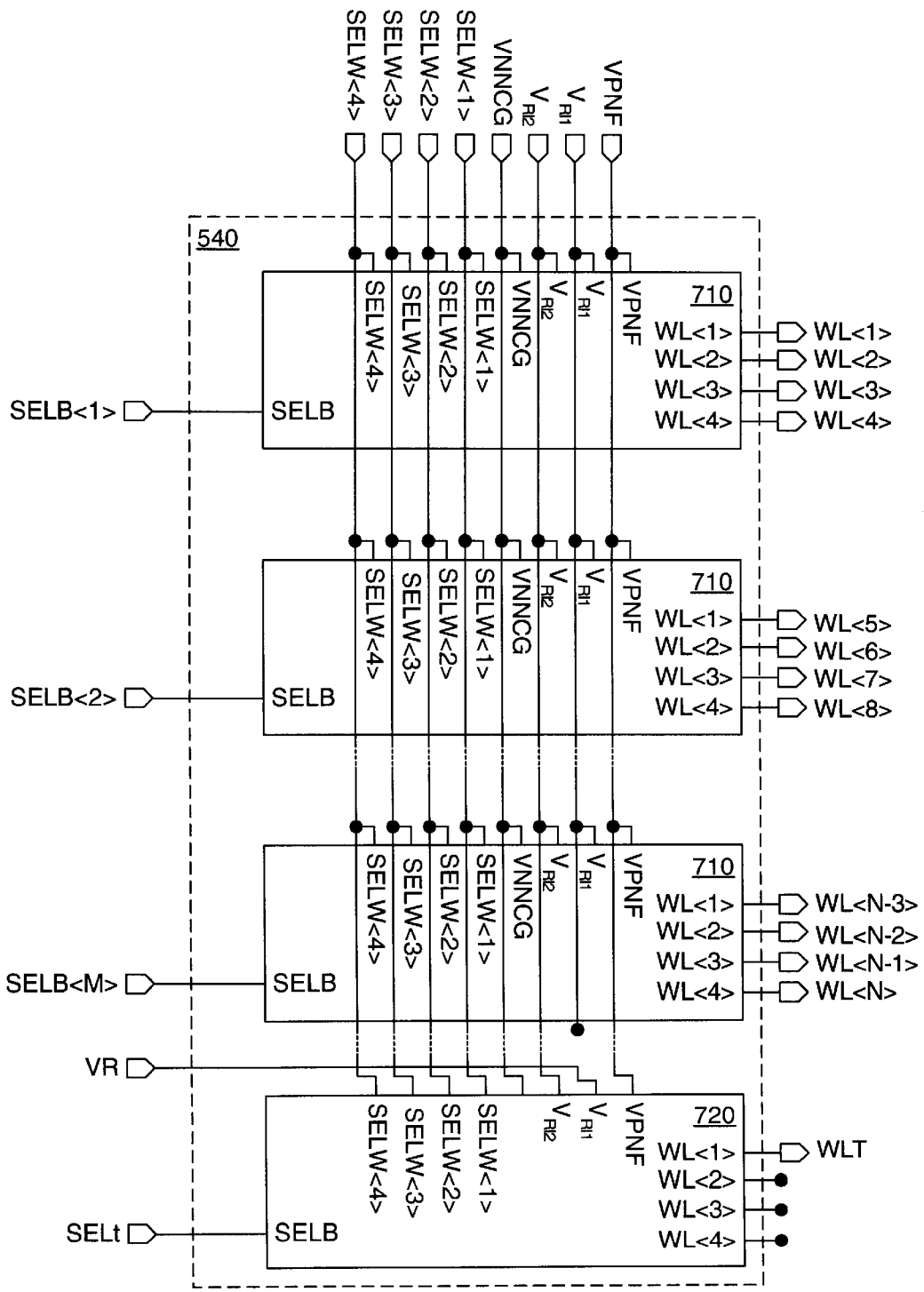
FIG. 7(a) is a detailed block diagram of row decoder.
FIG. 7(b) is a detailed block diagram of a row driver.
FIG. 7(c) is a detailed circuit diagram of a wordline driver.
FIG. 7(d) is a detailed circuit diagram of a wordline multiplexer.
Figure 7:
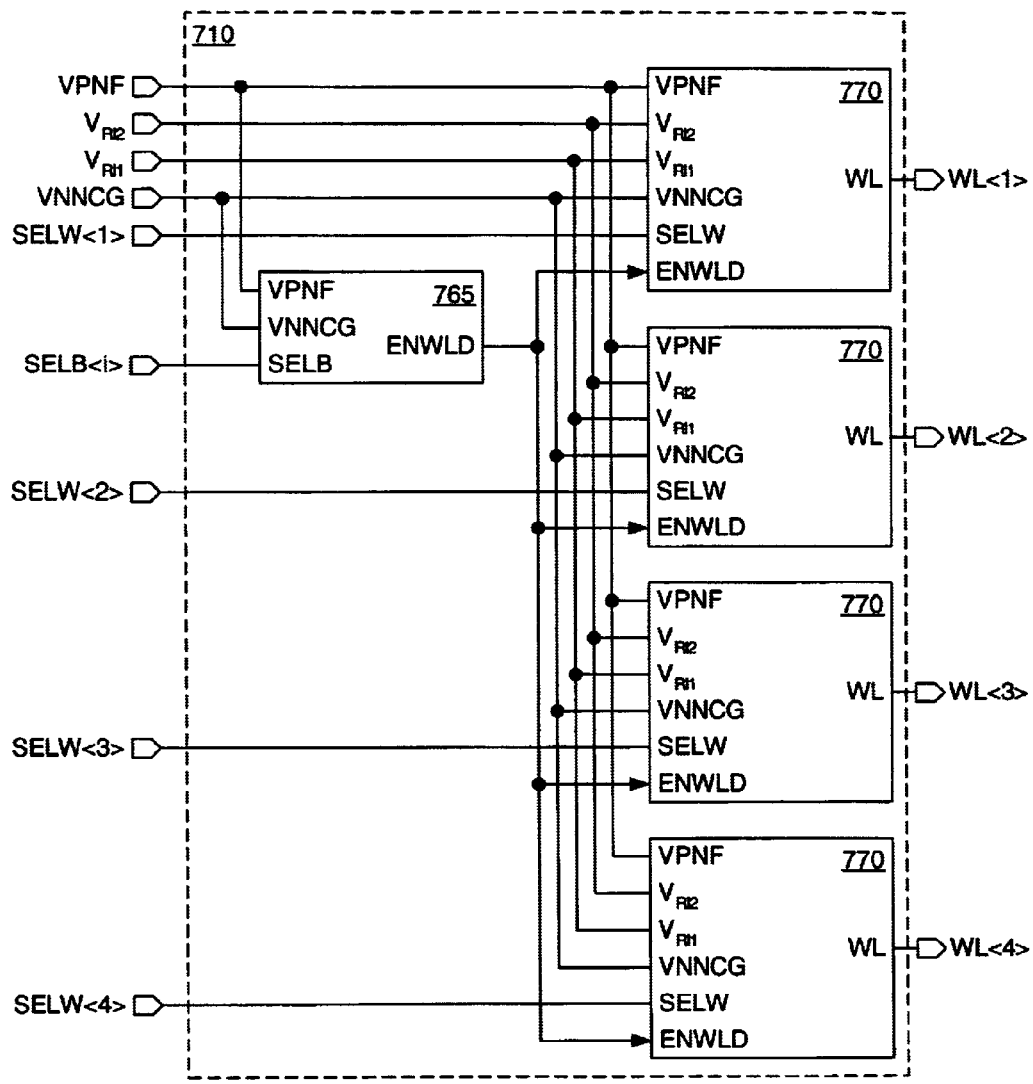
Figure 7:
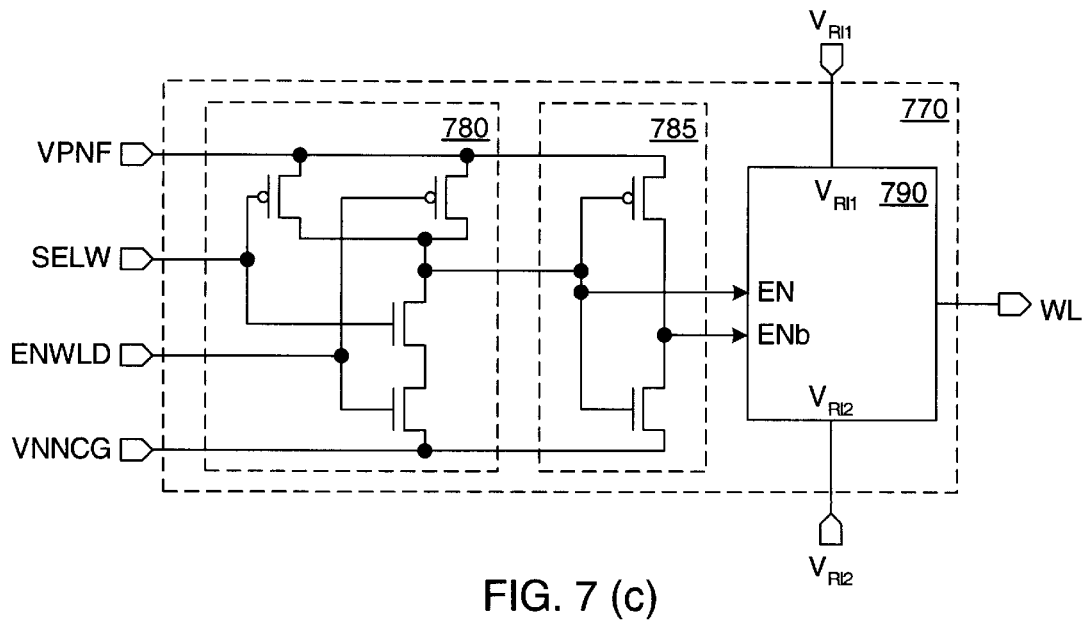
Figure 7:
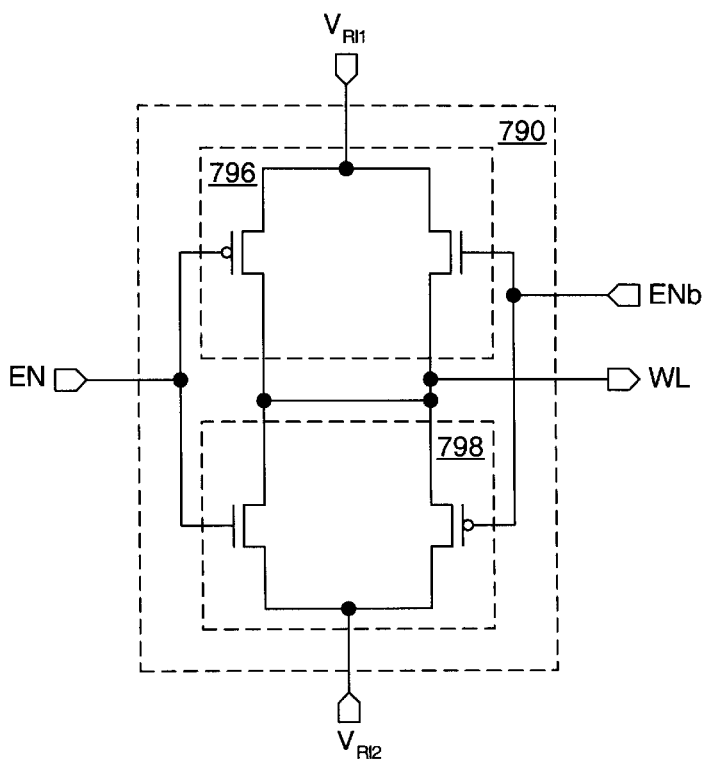

FIG. 7(a) details row decoder 540 of FIG. 5 in accordance with one embodiment of the invention. As noted above, row decoder 540 applies read-inhibit voltage $V_{RI1}$ to one of wordlines WL<1:N> and applies read-inhibit voltage $V_{RI2}$ to the remaining wordlines.

Row decoder 540 includes a plurality of row driver blocks 710 and a test row driver block 720. Each row driver block 710 connects to select-wordline signals SELW<1:4> and one of M select-block signals SELB<1:M>. The appropriate select-block signals SELB<i> (a block index).and select-wordline signals SELW<1:4> are asserted to apply the first read-inhibit voltage $V_{RI1}$ to a selected wordline; the remaining wordlines receive the second read-inhibit voltage $V_{RI2}$. To apply the first read-inhibit voltage on wordline WL<3>, for example, select-block signal SELB<1> and select-wordline signal SELW<3> are asserted.

Test row driver block 720 is similar to row driver blocks 710, but is modified such that it is active only during test-row read operations. During a test-row read operation, test-select-wordline signal SELt is asserted and read voltage $V_R$ applied to terminal $V_{RI1}$. In response, test row driver block 720 transmits read voltage $V_R$ to test wordline WLT.

FIG. 7(b) details an embodiment of row driver 710 of FIG. 7(a). Row driver 710 includes an enable-wordline driver circuit 765 similar to select-wordline driver 620 of FIG. 6(a) receiving input voltages,. VPNF and VNNCG, and a select-block signal SELB; and transmitting an enable-wordline driver signal ENWLD to wordline drivers 770. Similar to select-wordline driver 620, enable-wordline driver 765 shifts select-block signal SELB<i> from switching between a voltage range of zero-to-VDD to an enable-wordline driver signal ENWLD switching between a voltage range of VNNCG-to-VPNF. Enable-wordline driver 765 then transmits enable-wordline driver signal ENWLD to wordline drivers 770. Table 2 summarizes logic functionality of enable-wordline circuit 765.

TABLE 2

| SELB<i> | ENWLD |
|---------|-------|
| 0 | VNNCG |
| 1 | VPNF |

Wordline drivers 770 receive an enable-wordline driver signal ENWLD and a respective one of select-wordline signals SELW<1:4>, and either transmits a first read-inhibit voltage VRI1 or a second read-inhibit voltage VRI2 on wordline terminal WL. Table 3 summarizes the functionality of wordline drivers 770b.

TABLE 3

| ENWLD | SELW0 | SELW1 | SELW2 | SELW3 | WL<0> | WL<1> | WL<2> | WL<3> |
|-------|-------|-------|-------|-------|-------|-------|-------|-------|
| VPNF | VPNF | VNNCG | VNNCG | VNNCG | VRI1 | VRI2 | VRI2 | VRI2 |
| VPNF | VNNCG | VPNF | VNNCG | VNNCG | VRI2 | VRI1 | VRI2 | VRI2 |
| VPNF | VNNCG | VNNCG | VPNF | VNNCG | VRI2 | VRI2 | VRI1 | VRI2 |
| VPNF | VNNCG | VNNCG | VNNCG | VPNF | VRI2 | VRI2 | VRI2 | VRI1 |
| VNNCG | X | X | X | X | VRI2 | VRI2 | VRI2 | VRI2 |

From table 3 it can be seen that only the selected wordline transmits first read-inhibit voltage $V_{RI1}$ while all unselected wordlines transmit second read-inhibit voltage $V_{RI2}$. Thus during each test row read operation, only one wordline, the selected wordline, transmits head inhibit voltage $V_{RI1}$.

FIG. 7(c) details an embodiment of row driver circuit diagram 770 of FIG. 7(b). Wordline driver 770 includes conventional NAND and inverter gate configurations 780 and 785, respectively, having VPNF and VNNCG as supply voltages. NAND configuration 780 applies output signal EN to inverter configuration 785 and to a first control terminal of multiplexer 790. Inverter configuration 785 applies output signal ENb to a second control terminal of multiplexer 790. Multiplexer 790 transmits either first read-inhibit voltage $V_{RI1}$ or second read-inhibit voltage VRI2 to wordline output terminal WL as directed by control signals EN and ENb.

FIG. 7(d) details an embodiment of multiplexer 790 of FIG. 7(c). Multiplexer 790 includes first and second CMOS full pass gates 796 and 798 that alternately pass first read-inhibit voltage $V_{RI1}$ or second read-inhibit voltage $V_{RI2}$ as directed by enable signals EN and ENb.

While the present invention has been described in connection with specific embodiments, variations of these embodiments will be obvious to those of ordinary skill in the art. For example, instead of applying the second read-inhibit voltage to selected wordline and the first read-inhibit voltage to unselected wordlines, the first read-inhibit voltage can be applied to selected wordline and the second read-inhibit voltage to unselected wordlines. Moreover, some components are shown directly connected to one another while others are shown connected via intermediate components. In each instance the method of interconnection establishes some desired electrical communication between two or more circuit nodes, or terminals. Such communication may often be accomplished using a number of circuit configurations, as will be understood by those of skill in the art. Therefore, the spirit and scope of the appended claims should not be limited to the foregoing description.

What is claimed is:

1. A memory circuit comprising:
   a. a memory block including a plurality of wordlines;
   b. a wordline select circuit simultaneously applying at least three voltages, including first, second, and third wordline voltages, to the memory block, the wordline select circuit having:
      i. a first select-circuit output terminal providing the first wordline voltage to a first of the plurality of wordlines;
      ii. a second select-circuit output terminal providing the second wordline voltage to a second of the plurality of wordlines; and
      iii. a third select-circuit output terminal providing the third wordline voltage to a third of the plurality of wordlines.

2. The memory circuit of claim 1, the memory block further comprising memory cells arranged in rows and columns.

3. The memory circuit of claim 2, wherein each wordline of the plurality of wordlines connects to each of the memory cells in one of the rows.

4. The memory circuit of claim 3, wherein a first of the plurality of wordlines is a test wordline connected to the memory cells in a test row, the test wordline receiving the first wordline voltage.

5. The memory circuit of claim 4, wherein the first wordline voltage is a read voltage.

6. The memory circuit of claim 5, each memory cell in the test row exhibiting a threshold voltage greater than the read voltage.

7. The memory circuit of claim 6,
   a. wherein the second and third of the plurality of wordlines are connected to the memory cells in the respective second and third of the pluralities rows;
   b. wherein at least one memory cell of the second and third of the pluralities of rows is a defective memory cell; and
   c. wherein the defective memory cell is conductive in response to the second wordline voltage and nonconductive in response to the third wordline voltage.

8. The memory circuit of claim 7, wherein a plurality of the memory cells in the first and second pluralities of rows are nonconductive in response to the second wordline voltage and are nonconductive in response to the third wordline voltage.

9. The memory circuit of claim 8, wherein the defective memory cell is a leaky memory cell.

10. The memory circuit of claim 9, wherein subsequent to step (b) the wordline select circuit simultaneously applies the second wordline voltage to the third of the plurality of wordlines and the third wordline voltage to the second of the plurality of wordlines.

11. The memory circuit of claim 1, the memory block further comprising:
   a. a plurality of bitlines; and
   b. a shift register having a plurality of shift-register bits;
   c. wherein each shift-register bit is connected to a corresponding one of the plurality of bitlines.

12. The memory circuit of claim 1, further comprising a row-substitution circuit facilitating replacing a defective row with a redundant row.

13. A method of testing a memory block, the memory block including a plurality of wordlines, each wordline connected to a row of memory cells, the method comprising:
   a. configuring a first row of the memory cells to exhibit a high threshold voltage greater than a read voltage;
   b. configuring a second row of the memory cells to exhibit a low threshold voltage less than the read voltage;
   c. configuring a third row of the memory cells to exhibit the low threshold voltage less than the read voltage; and
   d. simultaneously applying:
      i. the read voltage to the first row of memory cells;
      ii. a first read-inhibit voltage to the second row of memory cells; and
      iii. a second read-inhibit voltage to the third row of memory cells;
      iv. wherein the first read-inhibit voltage is between the read voltage and the second read-inhibit voltage.

14. The method of claim 13, wherein the memory block further includes a plurality of bitlines, wherein each bitline of the plurality of bitlines connects to a corresponding memory cell in each row of memory cells, the method further comprising: sensing the bitlines while simultaneously applying the read voltage and the first and second read-inhibit voltages.

15. The method claim of 14, wherein the memory block includes a shift register having a plurality of shift-register bits, each shift-register bit connected to a corresponding one of the bitlines.

16. The method of claim 15, further comprising storing logic levels representative of bitline voltages in the shift-register bits and comparing the stored logic levels to expected logic levels, wherein a mismatch between a stored logic level and an expected logic level signifies at least one defective memory cell.

17. The method of claim 16, the method further comprising storing an address corresponding to the defective memory cell.

18. The method of claim 13, further comprising:
   e. subsequent to step (d), simultaneously applying:
      i. the read voltage to the first row of memory cells;
      ii. the second read-inhibit voltage to the second row of memory cells; and
      iii. the first read-inhibit voltage to the third row of memory cells.

19. The method of claim 18, wherein the memory block further includes a plurality of bitlines, wherein each bitline of the plurality of bitlines connects to a corresponding memory cell in each row of memory cells, the method further comprising: sensing the bitlines during steps (d) and (e).

\* \* \* \* \*